US012796454B2

(12) United States Patent
Lin et al.

(10) Patent No.: US 12,796,454 B2
(45) Date of Patent: Nov. 10, 2026

(54) SEMICONDUCTOR DEVICE USING ONE OR MORE SLOTS ADDED TO ISOLATION REGION SURROUNDING INDUCTOR FOR ISOLATION IMPROVEMENT

(71) Applicant: MEDIATEK INC., Hsin-Chu (TW)

(72) Inventors: Ang-Sheng Lin, Hsinchu City (TW); Yen-Liang Yeh, Hsinchu City (TW); Hao-Wei Huang, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 633 days.

(21) Appl. No.: 18/119,805

(22) Filed: Mar. 9, 2023

(65) Prior Publication Data

US 2023/0317598 A1 Oct. 5, 2023

Related U.S. Application Data

(60) Provisional application No. 63/325,618, filed on Mar. 31, 2022.

(51) Int. Cl.

*H10D 1/20* (2025.01)
*H10W 20/40* (2026.01)
*H10W 42/20* (2026.01)
*H10W 44/20* (2026.01)

(52) U.S. Cl.

CPC ............ *H10W 20/497* (2026.01); *H10D 1/20* (2025.01); *H10W 44/20* (2026.01); *H10W 44/241* (2026.01)

(58) Field of Classification Search

CPC ....... H10D 1/20; H01L 23/5227; H01L 23/66; H01L 23/552; H01L 23/645; H10W 20/497; H10W 42/267; H10W 42/20; H10W 44/20; H10W 44/241; H10W 44/501; H10W 72/50; H10W 72/5525; H10W 90/00; H10W 90/754

See application file for complete search history.

(56) References Cited

U.S. PATENT DOCUMENTS

| | | | | |
|---|---|---|---|---|
| 2003/0062541 | A1* | 4/2003 | Warner | H10W 44/501 257/E23.092 |
| 2008/0001186 | A1 | 1/2008 | Shastri | |
| 2011/0156224 | A1* | 6/2011 | Rokuhara | H01L 23/645 257/659 |
| 2019/0393148 | A1* | 12/2019 | Uchida | H10D 1/20 |
| 2020/0194378 | A1* | 6/2020 | Tang | H10W 44/501 |
| 2021/0225998 | A1* | 7/2021 | Yen | H10D 1/20 |

FOREIGN PATENT DOCUMENTS

| | | |
|---|---|---|
| TW | 200901551 | 1/2009 |
| TW | 201729382 A | 8/2017 |
| TW | 202040610 A | 11/2020 |

* cited by examiner

*Primary Examiner* — Omar F Mojaddedi
(74) *Attorney, Agent, or Firm* — Winston Hsu

(57) ABSTRACT

A semiconductor device includes a metal layer, a ground plane formed on the metal layer, a first inductor formed on the metal layer, and a first isolation region formed on the metal layer and arranged to separate the first inductor from the ground plane. The first isolation region includes a first main area surrounding the first inductor, and at least one first slot extended from the first main area.

11 Claims, 6 Drawing Sheets

SEMICONDUCTOR DEVICE USING ONE OR MORE SLOTS ADDED TO ISOLATION REGION SURROUNDING INDUCTOR FOR ISOLATION IMPROVEMENT

CROSS REFERENCE TO RELATED APPLICATIONS

This application claims the benefit of U.S. Provisional Application No. 63/325,618, filed on Mar. 31, 2022. The content of the application is incorporated herein by reference.

BACKGROUND

The present invention relates to an isolation technique, and more particularly, to a semiconductor device using one or more slots added to an isolation region surrounding an inductor for isolation improvement.

Inductors are indispensable to many circuits. However, an inductor of one circuit may be interfered with an inductor of another circuit due to mutual inductance. Specifically, when two inductors are brought in proximity with each other, the magnetic field in one of the inductors tends to link with the other, which further leads to the generation of current and voltage in the other inductor. This property of an inductor which affects or changes the current and voltage in the other inductor is called mutual inductance. A typical inductor isolation improvement technique is to increase the distance between two inductors. However, when the typical inductor isolation improvement technique is employed, the circuit design suffers from a strict layout constraint due to such a long safety distance between inductors. Thus, there is a need for an innovative inductor isolation design which is capable of achieving isolation improvement to meet the isolation requirement under a shorter safety distance.

SUMMARY

One of the objectives of the claimed invention is to provide a semiconductor device using one or more slots added to an isolation region surrounding an inductor for isolation improvement.

According to a first aspect of the present invention, an exemplary semiconductor device is disclosed. The exemplary semiconductor device includes a metal layer, a ground plane formed on the metal layer, a first inductor formed on the metal layer, and a first isolation region formed on the metal layer and arranged to separate the first inductor from the ground plane. The first isolation region includes a first main area and at least one first slot. The first main area surrounds the first inductor. The at least one first slot is extended from the first main area.

According to a second aspect of the present invention, an exemplary semiconductor device is disclosed. The exemplary semiconductor device includes a metal layer, a ground plane formed on the metal layer, the first inductor formed on the metal layer, the second inductor formed on the metal layer, and a first isolation region formed on the metal layer and arranged to separate the first inductor from the ground plane. A shape of the first isolation region is configured to reduce a coupling coefficient of mutual inductance between the first inductor and the second inductor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
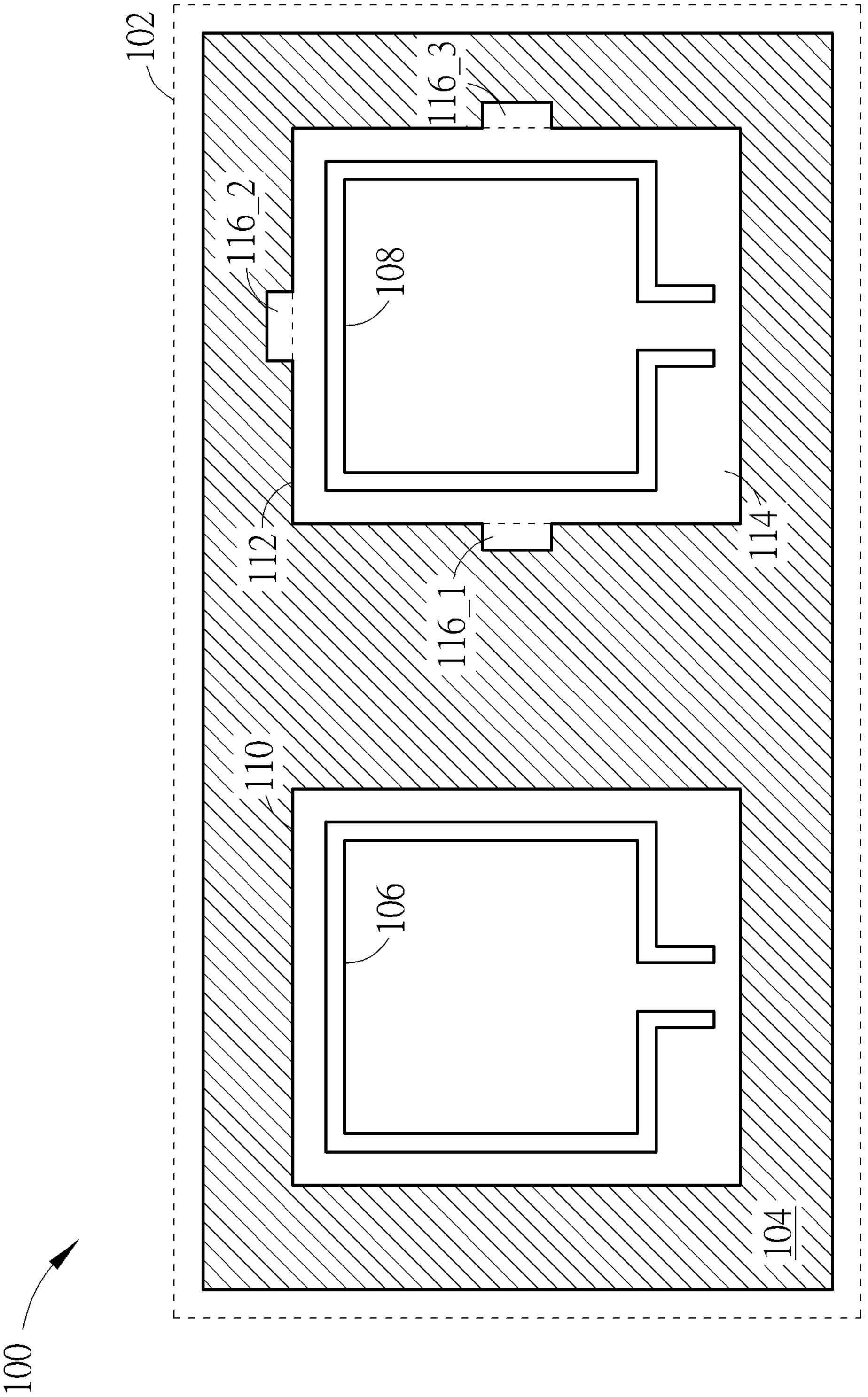
FIG. 1 is a diagram illustrating a semiconductor device according to an embodiment of the present invention.

FIG. 1 is a diagram illustrating a semiconductor device according to an embodiment of the present invention. The semiconductor device 100 is manufactured by a semiconductor process. As shown in FIG. 1, the semiconductor device 100 has a metal layer 102 such as a top metal layer, and further has a plurality of components formed on the metal layer 102. For example, the components formed on the metal layer 102 may include a ground plane (e.g., Super-GND) 104, a plurality of inductors (e.g., two inductors 106 and 108), and a plurality of isolation regions (e.g., two isolation regions 110 and 112). The isolation region 110 formed on the metal layer 102 is arranged to separate the inductor 106 from the ground plane 104. The isolation region 112 formed on the metal layer 102 is arranged to separate the inductor 108 from the ground plane 104. In this embodiment, the inductor 106 is an aggressor, and the inductor 108 placed in the proximity of the inductor 106 is a victim. To improve the isolation of the inductor 108, the isolation region 112 is particularly designed to have a main area 114 surrounding the inductor 108, and at least one slot (e.g., slots 116_1, 116_2, and 116_3) extended from the main area 114. A shape of the isolation region 112 is configured to reduce a coupling coefficient K of mutual inductance between the inductor (e.g., victim) 108 and the inductor (e.g., aggressor) 106. In this embodiment, the at least one slot (e.g., at least one GND-slot removed from the ground plane 104) is particularly configured to reduce the coupling coefficient K of mutual inductance between the inductor (e.g., victim) 108 and the inductor (e.g., aggressor) 106, thereby achieving inductor isolation improvement for the inductor (e.g., victim) 108 and enabling a shorter safety distance between the inductor (e.g., victim) 108 and the inductor (e.g., aggressor) 106 under the requested isolation requirement (e.g., |K|<1 u). Note that the requested isolation requirement may vary depending on different specifications of semiconductor device. For example, in another embodiment, |K|<1000 u.

It should be noted that positions and size of slots 116_1-116_3 shown in FIG. 1 are for illustrative purposes only, and are not meant to be limitations of the present invention. In practice, a position of the at least one slot depends on a relative position between the inductor (e.g., victim) 108 and the inductor (e.g., aggressor) 106; and a size of the at least one slot depends on a compensation range of the coupling coefficient K of mutual inductance between the inductor (e.g., victim) 108 and the inductor (e.g., aggressor) 106.

Figure 2:
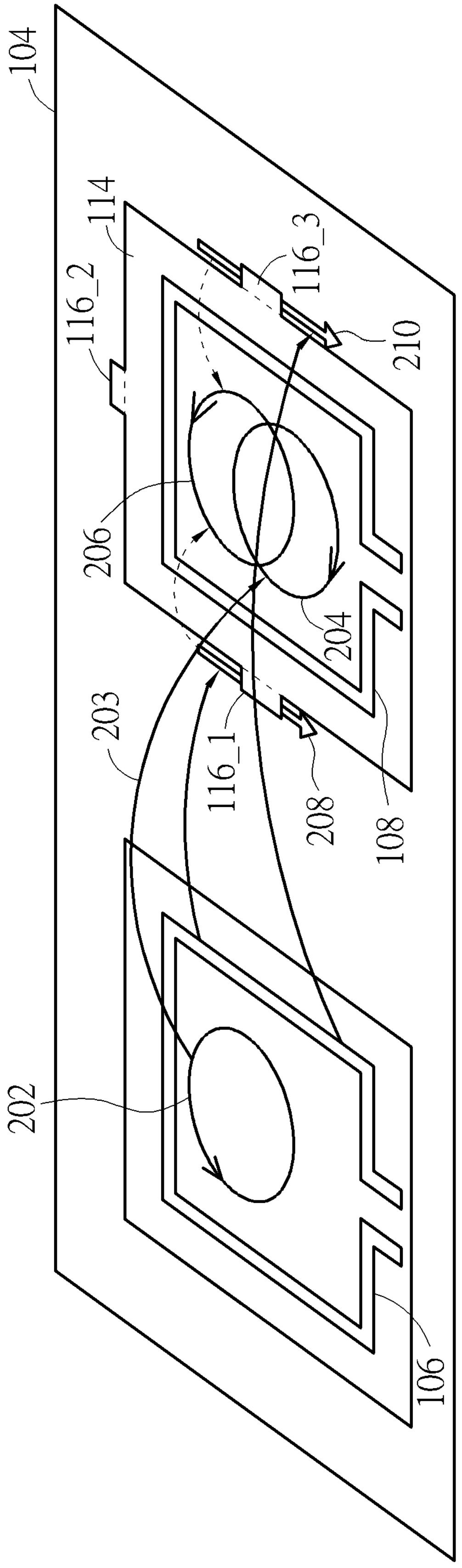
FIG. 2 is a diagram illustrating coupling between inductors shown in FIG. 1.
Figure 3:
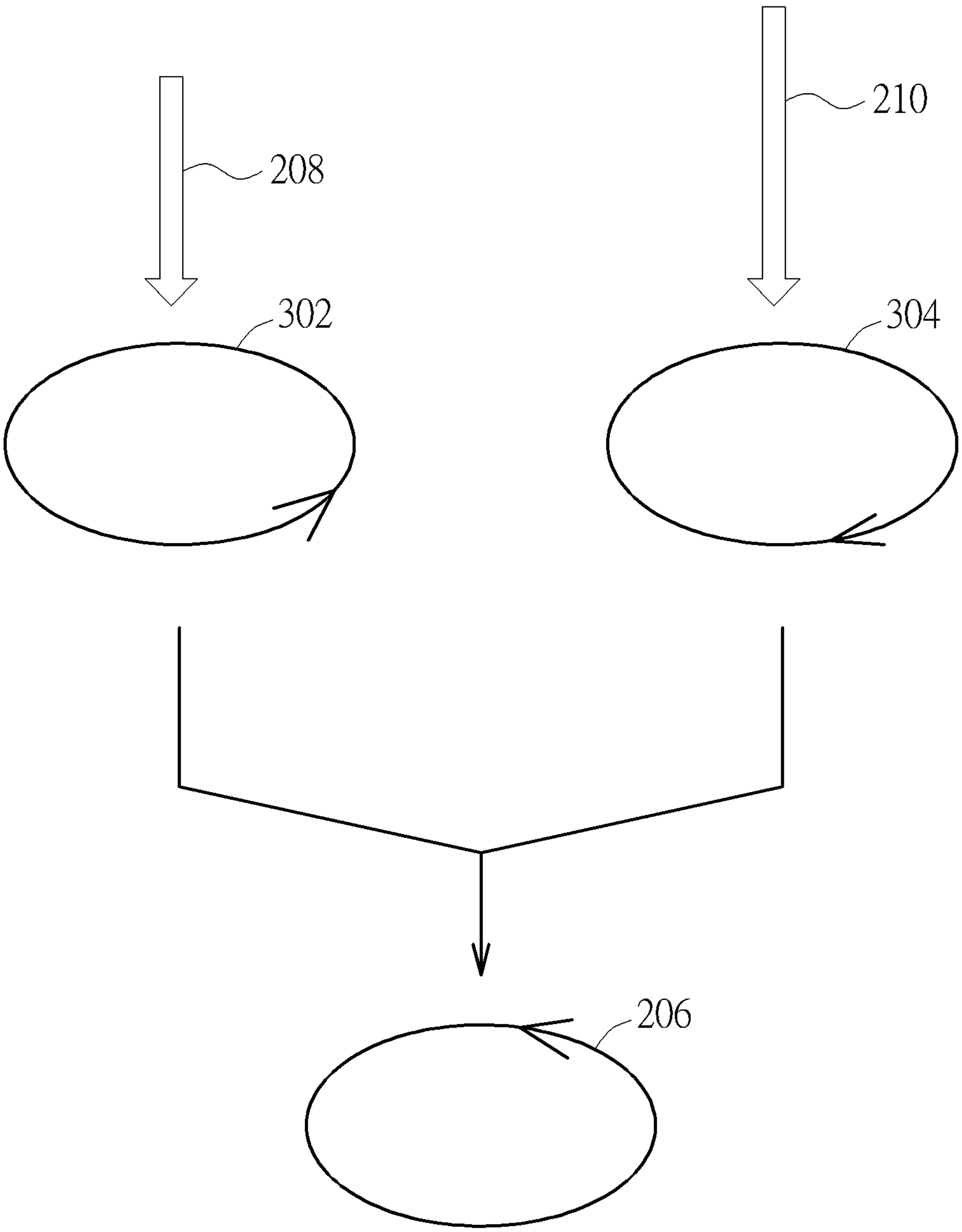
FIG. 3 is a diagram illustrating polarities of induced currents at an inductor (e.g., victim) that result from surrounding currents on a ground plane shown in FIG. 1.

The principle of using at least one slot implemented in the isolation region 112 to improve isolation of the inductor 108 is described with reference to the accompanying drawings. Please refer to FIG. 2 in conjunction with FIG. 3. FIG. 2 is a diagram illustrating coupling between the inductor (e.g., victim) 108 and the inductor (e.g., aggressor) 106 shown in FIG. 1. FIG. 3 is a diagram illustrating polarities of induced currents at the inductor (e.g., victim) 108 that result from surrounding currents on the ground plane 104. A magnetic flux produced by a current 202 flowing through the inductor 106 is coupled to the inductor 108 through a main coupling path 203, which results in an induced current 204 at the inductor 108. In response to the magnetic flux produced by the current 202 at the inductor 106, induced currents (e.g., 208 and 210) that are close to the inductor 108 and flow on the ground plane (e.g., Super-GND) 104 are created. Hence, another induced current 206 at the inductor 108 results from the induced currents 208 and 210 on the ground plane 104. As shown in FIG. 3, the induced current 206 at the inductor 108 may be decomposed into an induced current 302 with first polarity and first magnitude and an induced current 304 with second polarity (which is opposite to the first polarity) and second magnitude, where the induced current 302 results from a magnetic flux produced by the induced current 208 on the ground plane 104, and the induced current 304 results from a magnetic flux produced by the induced current 210 on the ground plane 104. With the help of the at least one slot (e.g., slots 116_1, 116_2, and 116_3), the induced currents 208 and 210 surrounding the inductor 108 can be adjustable, thus creating the induced current 206 with non-zero magnitude that can be combined with the induced current 204 for reducing or minimizing the magnitude of the induced current 204 (which is induced via the main coupling path 203). The main coupled current (i.e., induced current 204) can be reduced or cancelled by properly trimming the induced currents 208 and 210. In a case where the induced currents 204 and 206 have the same magnitude but opposite polarities, the coupling coefficient K of mutual inductance between the inductor (e.g., aggressor) 106 and the inductor (e.g., victim) 108 may be trimmed to a zero value without degradation of a quality factor (Q) of the inductor 108.

Compared to an inductor isolation improvement technique that places a shielding ring around an on-chip inductor, the proposed inductor isolation improvement technique does not have an impact on the quality factor of the on-chip inductor, does not shift an inductance value of the on-chip inductor, and can have isolation improvement much larger than 10 dB. Compared to an inductor isolation improvement technique that uses an 8-shaped inductor as an on-chip inductor, the proposed inductor isolation improvement technique does not suffer from self-cancellation deconstruction caused by unbalanced fields of the 8-shaped inductor, and therefore can work well when the isolation requirement is tough.

The position of the at least one slot depends on a relative position between the inductor (e.g., victim) 108 and the inductor (e.g., aggressor) 106. For example, regarding trimming of the coupling coefficient K, the position of one slot (e.g., any of slots 116_1, 116_2, and 116_3) can be determined by a simple trial and error method. However, this is for illustrative purposes only, and is not meant to be a limitation of the present invention.

Figure 4:
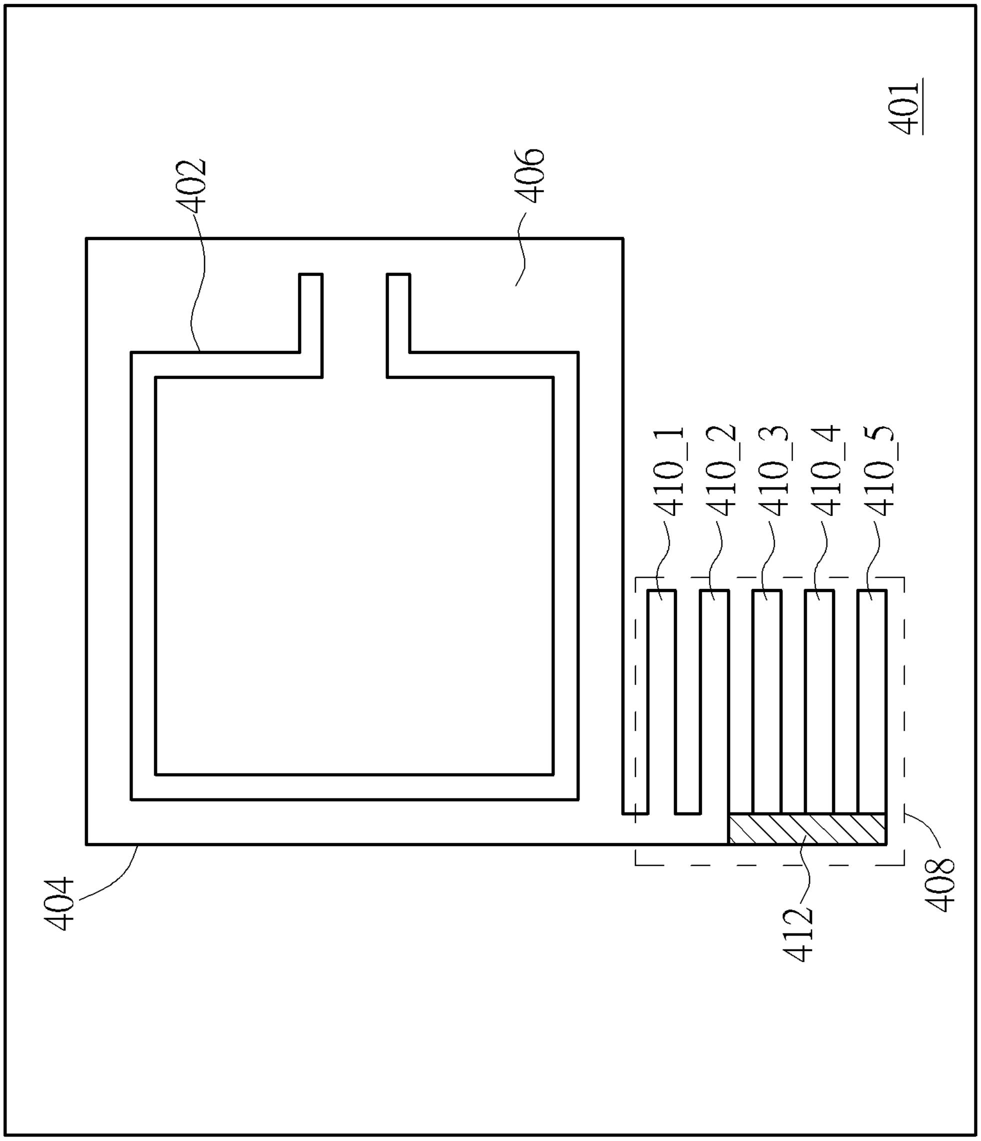
FIG. 4 is a diagram illustrating a first configurable slot design used to adjust an induced current surrounding an inductor according to an embodiment of the present invention.

The size of the at least one slot depends on a compensation range of the coupling coefficient K. For example, the size of one slot (e.g., any of slots 116_1, 116_2, and 116_3) can be configured by a metal option. The size of one slot (e.g., any of slots 116_1, 116_2, and 116_3) is not reconfigurable after the metal option is selected and then manufactured in the foundry. FIG. 4 is a diagram illustrating a first configurable slot design used to adjust an induced current surrounding an inductor according to an embodiment of the present invention. An inductor 402 is isolated from a ground plane 401 by an isolation region 404 including a main part 406 and a configurable slot array 408. For example, the inductor 108 shown in FIG. 1 may be implemented by the inductor 402 shown in FIG. 4, and the isolation region 112 shown in FIG. 1 may be implemented by the isolation region 404 shown in FIG. 4. For brevity and simplicity, only one configurable slot array 408 is shown in FIG. 4. In practice, the isolation region 404 is allowed to have more than one configurable slot array 408, depending upon actual design considerations.

The configurable slot array 408 includes a plurality of slots 410_1, 410_2, 410_3, 410_4, 410_5. The effective size of the configurable slot array 408 is decided by a metal option 412. In this example, the metal option 412 is fabricated in the foundry, and is connected to the ground plane 401 and separates the slots 410_3, 410_4, 410_5 from the slots 410_1, 410_2, where each of the slots 410_3, 410_4, 410_5 is surrounded by the ground voltage and may be regarded as a part of the ground plane 401. Hence, the effective size of the configurable slot array 408 depends on sizes of the slots 410_1, 410_2 only. In other words, the effective size of the configurable slot array 408 depends on the number of slots that are not disabled by the metal option 412. With a proper design of the metal option 412, the effective size of the configurable slot array 408 can meet the requirement of reducing or minimizing the coupling coefficient K for isolation improvement of the inductor 402.

Figure 5:
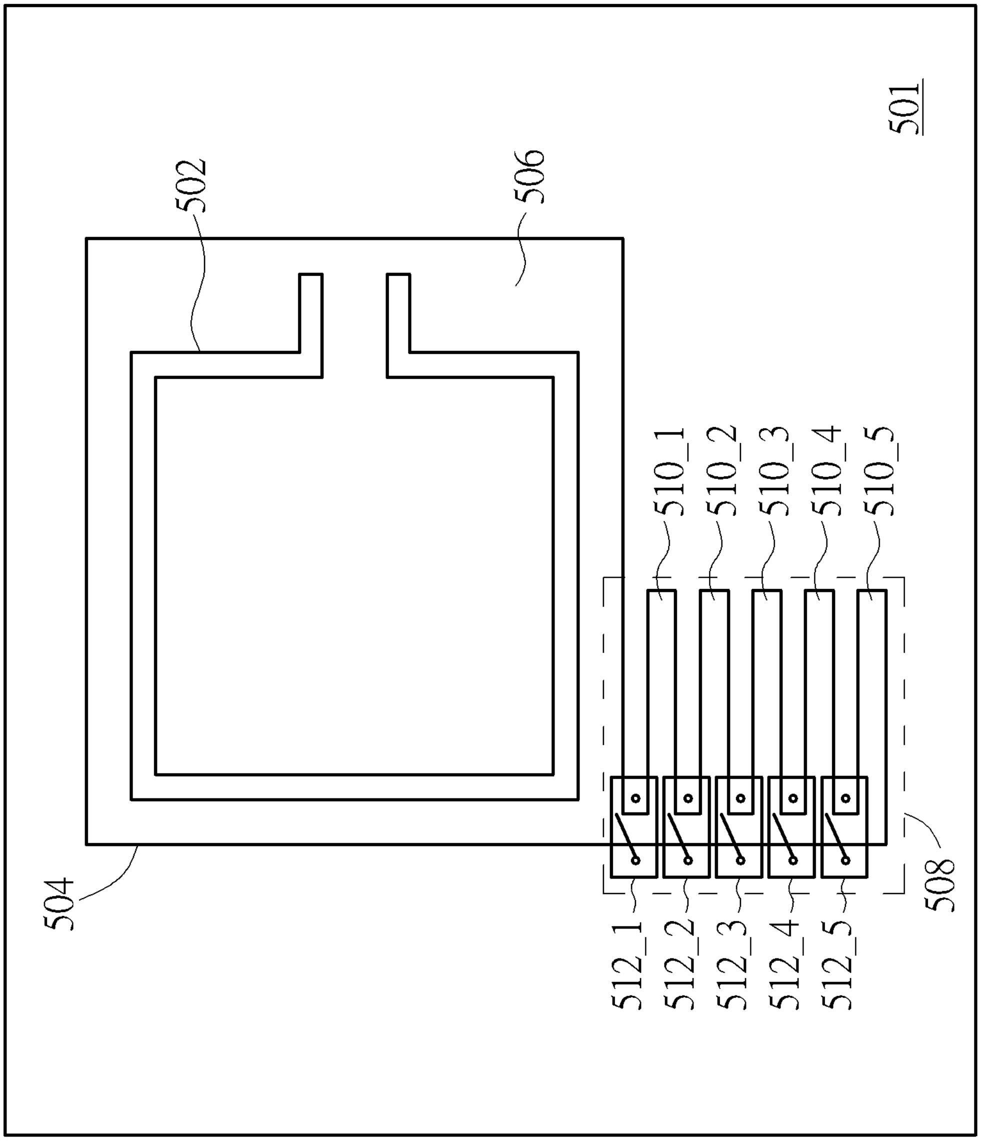
FIG. 5 is a diagram illustrating a second configurable slot design used to adjust an induced current surrounding an inductor according to an embodiment of the present invention.

For another example, the size of one slot (e.g., any of slots 116_1, 116_2, and 116_3) can be configured by at least one metal-oxide-semiconductor (MOS) switch. Hence, the size of one slot (e.g., any of slots 116_1, 116_2, and 116_3) can be reconfigurable through adjusting an on/off state of each MOS switch. FIG. 5 is a diagram illustrating a second configurable slot design used to adjust an induced current surrounding an inductor according to an embodiment of the present invention. An inductor 502 is isolated from a ground plane 501 by an isolation region 504 including a main part 506 and a configurable slot array 508. For example, the inductor 108 shown in FIG. 1 may be implemented by the inductor 502 shown in FIG. 5, and the isolation region 112 shown in FIG. 1 may be implemented by the isolation region 504 shown in FIG. 4. For brevity and simplicity, only one configurable slot array 508 is shown in FIG. 5. In practice, the isolation region 504 is allowed to have more than one configurable slot array 508, depending upon actual design considerations.

The configurable slot array 508 includes a plurality of slots 510_1, 510_2, 510_3, 510_4, 510_5. The size of the configurable slot array 508 is decided by on/off states of a plurality of MOS switches 512_1, 512_2, 512_3, 512_4, 512_5, each having two ends connected to the ground plane 501. When the MOS switch 512_5 is turned on, the slot 510_5 is surrounded by the ground voltage and may be regarded as a part of the ground plane 501. When the MOS switches 512_4 and 512_5 are turned on, each of the slots 510_4 and 510_5 is surrounded by the ground voltage and may be regarded as a part of the ground plane 501. When the MOS switches 512_3, 512_4 and 512_5 are turned on, each of the slots 510_3, 510_4 and 510_5 is surrounded by the ground voltage and may be regarded as a part of the ground plane 501. When the MOS switches 512_2, 512_3, 512_4 and 512_5 are turned on, each of the slots 510_2, 510_3, 510_4 and 510_5 is surrounded by the ground voltage and may be regarded as a part of the ground plane 501. When the MOS switches 512_1, 512_2, 512_3, 512_4 and 512_5 are turned on, each of the slots 510_1, 510_2, 510_3, 510_4 and 510_5 is surrounded by the ground voltage and may be regarded as a part of the ground plane 501. Hence, the configurable slot array 508 has a smallest size when all of the MOS switches 512_1-512_5 are turned on, and has a largest size when none of the MOS switches 512_1-512_5 is turned on. An effective size of the configurable slot array 508 depends on the number of MOS switches that are turned off. With a proper control of the MOS switches 512_1-512_5, the effective size of the configurable slot array 508 can meet the requirement of reducing or minimizing the coupling coefficient K for isolation improvement of the inductor 502.

The coupling coefficient K of mutual inductance between the inductor (e.g., victim) 108 and the inductor (e.g., aggressor) 106 can be reduced by properly configuring the at least one slot (e.g., slots 116_1-116_3) extended from the main part 114 of the isolation region 112, which allows a shorter safety distance between the inductor (e.g., victim) 108 and the inductor (e.g., aggressor) 106. For example, a safety distance between the inductor (e.g., victim) 108 and the inductor (e.g., aggressor) 106 may be shorter than 4000 micrometers (um), and the absolute value of the coupling coefficient K may be smaller than 1000 u for meeting the isolation requirement depending on specifications of the semiconductor device. In other examples, the safety distance between the inductor (e.g., victim) 108 and the inductor (e.g., aggressor) 106 is shorter than 900 micrometers (um), and the at least one slot (e.g., slots 116_1-116_3) extended from the main part 114 of the isolation region 112 is configured to make an absolute value of the coupling coefficient K smaller than 1 u for meeting the isolation requirement. For example, with the help of the configurable slot array 408/508, an absolute value of the coupling coefficient K can be trimmed from a large value (e.g., K=10 u) to a small value (e.g., K<1 u), which is equivalent to a 20 dB-50 dB improvement. With the help of the 20 dB-50 dB improvement of the coupling coefficient K, the safety distance can be reduced from a large value (e.g., 1800 um) to a small value (e.g., 850 um), where the isolation requirement (e.g., |K|<1 u) can still be met under a condition that the distance between inductors 106 and 108 is equal to the small value (e.g., 850 um).

In the above embodiment, the proposed inductor isolation improvement technique is applied to an inductor being a victim. However, this is for illustrative purposes only, and is not meant to be a limitation of the present invention. Since an inductor is a passive component, the proposed inductor isolation improvement technique can be applied to an inductor being either a victim or an aggressor.

Figure 6:
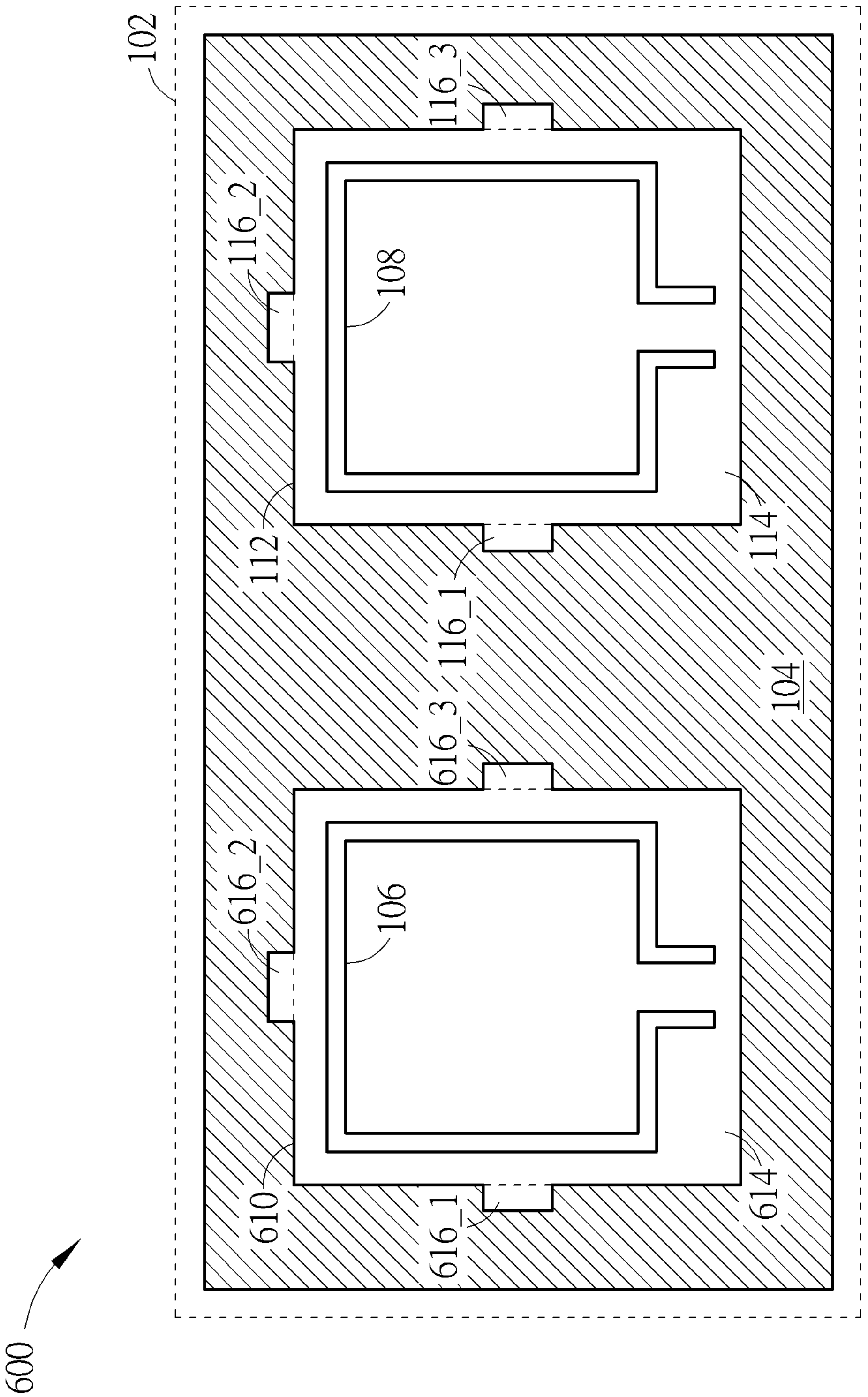
FIG. 6 is a diagram illustrating another semiconductor device according to an embodiment of the present invention.

FIG. 6 is a diagram illustrating another semiconductor device according to an embodiment of the present invention. The semiconductor device 600 is manufactured by a semiconductor process. The major difference between the semiconductor devices 100 and 600 is that the proposed inductor isolation improvement technique is applied to both of an aggressor (e.g., one of inductors 106 and 108) and a victim (e.g., the other of inductors 106 and 108). As shown in FIG. 6, the semiconductor device 600 has a plurality of components formed on the metal layer 102. For example, the components formed on the metal layer 102 may include the ground plane (e.g., Super-GND) 104, a plurality of inductors (e.g., two inductors 106 and 108), and a plurality of isolation regions (e.g., two isolation regions 610 and 112). The isolation region 610 formed on the metal layer 102 is arranged to separate the inductor 106 from the ground plane 104. Like the isolation region 112, the isolation region 610 is designed to have a main area 614 surrounding the inductor 106, and at least one slot (e.g., slots 616_1, 616_2, and 616_3) extended from the main area 614 for adjusting induced currents surrounding the inductor 106. Each of the slots 616_1, 616_2, and 616_3 may be implemented by the aforementioned configurable slot array 408/508. Since a person skilled in the art can readily understand details of the at least one slot (e.g., slots 616_1, 616_2, and 616_3) used for inductor isolation improvement after reading above paragraphs, further description is omitted here for brevity.

In some embodiments, the inductor 106 may be a part of a first digitally controlled oscillator (DCO), and the inductor 108 may be a part of a second DCO that is placed in the proximity of the first DCO, where the proposed inductor isolation improvement technique enables a shorter safety distance between the inductors 106 and 108 under a condition that the isolation requirement is met. By way of example, but not limitation, both of the first DCO and the second DCO are included in the same radio-frequency (RF) chip. However, this is for illustrative purposes only, and is not meant to be a limitation of the present invention. The inductor 106 may be a part of an oscillator, an amplifier, a balun, a transformer, a mixer or a divider. The inductor 108 may be apart of an oscillator, an amplifier, a balun, a transformer, a mixer, or a divider. In practice, any semiconductor device using the proposed inductor isolation improvement technique falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
a metal layer;
a ground plane, formed on the metal layer;
a first inductor, formed on the metal layer; and
a first isolation region, formed on the metal layer and arranged to separate the first inductor from the ground plane, wherein the first isolation region comprises:
a first main area, surrounding the first inductor; and
at least one first slot, extended from the first main area;

wherein the ground plane is coplanar with the first isolation region, the first main area is coplanar with the at least one first slot, and the at least one first slot is configured to trim at least one induced current on the ground plane.

2. The semiconductor device of claim 1, further comprising:

a second inductor, formed on the metal layer;

wherein the at least one first slot is configured to reduce a coupling coefficient of mutual inductance between the first inductor and the second inductor.

3. The semiconductor device of claim 2, wherein a position of the at least one first slot depends on a relative position between the first inductor and the second inductor.

4. The semiconductor device of claim 2, wherein a size of the at least one first slot depends on a compensation range of the coupling coefficient.

5. The semiconductor device of claim 2, wherein the at least one first slot is configured to make the coupling coefficient equal to a zero value.

6. The semiconductor device of claim 2, wherein a size of the at least one first slot is configured by a metal option.

7. The semiconductor device of claim 2, wherein a size of the at least one first slot is configured by at least one metal-oxide-semiconductor (MOS) switch.

8. The semiconductor device of claim 2, wherein the first inductor is a part of an oscillator, an amplifier, a balun, a transformer, a mixer or a divider.

9. The semiconductor device of claim 2, wherein the first inductor is a part of a radio-frequency (RF) chip, and the second inductor is a part of the RF chip.

10. The semiconductor device of claim 2, further comprising:

a second isolation region, formed on the metal layer and arranged to separate the second inductor from the ground plane, wherein the second isolation region comprises:

a second main area, surrounding the second inductor; and at least one second slot, extended from the second main area.

11. The semiconductor device of claim 10, wherein the at least one second slot is configured to reduce the coupling coefficient of mutual inductance between the first inductor and the second inductor.

* * * * *